(12) United States Patent
Ho et al.

(10) Patent No.: US 7,081,019 B2
(45) Date of Patent: Jul. 25, 2006

(54) LOW PROFILE CONTACT BLOCK FOR A RECHARGEABLE CELL OF A WIRELESS COMMUNICATION DEVICE

(75) Inventors: Suang Tien Ho, Pulau Pinang (MY); Soon Cheng Chung, Butterworth, Pul (MY); Wiling Tan, Bayan Lepas, Pul (MY)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/941,469

(22) Filed: Sep. 15, 2004

(65) Prior Publication Data

US 2006/0057872 A1    Mar. 16, 2006

(51) Int. Cl.
*H01R 24/00* (2006.01)
(52) U.S. Cl. ..................................... 439/629
(58) Field of Classification Search ............. 439/541.5, 439/83, 629, 632, 874
See application file for complete search history.

(56) References Cited

U.S. PATENT DOCUMENTS

| | | | | | |
|---|---|---|---|---|---|
| 4,636,022 A | * | 1/1987 | Sonobe | ........................ | 439/326 |
| 4,979,903 A | * | 12/1990 | Gosselin | ........................ | 439/78 |
| 4,990,107 A | * | 2/1991 | Fortuna | ........................ | 439/637 |
| 5,218,806 A | * | 6/1993 | Taylor | ........................ | 52/410 |
| 5,232,400 A | * | 8/1993 | Chang et al. | ................ | 439/326 |
| 5,972,150 A | * | 10/1999 | Copp | ........................ | 156/228 |
| 6,059,606 A | * | 5/2000 | Okuyama et al. | ........... | 439/607 |
| 6,183,273 B1 | * | 2/2001 | Yu et al. | ........................ | 439/92 |
| 6,257,905 B1 | | 7/2001 | Johnson | | |
| 6,497,580 B1 | * | 12/2002 | Watanabe et al. | ............. | 439/65 |
| 6,736,676 B1 | * | 5/2004 | Zhang et al. | ................ | 439/607 |

* cited by examiner

*Primary Examiner*—Chandrika Prasad
(74) *Attorney, Agent, or Firm*—Hisashi D. Watanabe

(57) ABSTRACT

A low-profile, insert molded contact block and corresponding printed circuit board assembly are provided for coupling electronic circuitry disposed on printed wiring boards to external electronic devices. The contact block includes a plurality of L-shaped, metal contacts insert molded into a housing. The housing includes bracing members that circumscribe the metal contacts so that at least a portion of the front and rear faces of the metal contacts are exposed between the bracing members. The contact block may be coupled to a printed wiring board in an automated, reflow solder process utilizing automated pick and place equipment. The contact block is placed on the printed wiring board such that the metal contacts are seated on conductive pads with solder paste disposed thereon. The resulting assembly may then be heated in a reflow oven to permanently affix the metal contacts to the conductive pads. The contact block, which can be on the order of 0.6 millimeters thick, can significantly reduce the overall size of the host electronic device.

7 Claims, 3 Drawing Sheets

LOW PROFILE CONTACT BLOCK FOR A RECHARGEABLE CELL OF A WIRELESS COMMUNICATION DEVICE

BACKGROUND

1. Technical Field

This invention relates generally to contact blocks for coupling electronic circuits to other devices, and more specifically to a low-profile, insert molded contact block for use in designs where space is constrained.

2. Background Art

Most all electronic products have a need to connect to other devices. For example, most all electronic devices have a need for power. Power is generally fed from a power source, like a power supply, to an electronic circuit located on a printed circuit board. The component that often facilitates this connection is a contact block.

A contact block is traditionally a piece of plastic with metal contacts wrapped around the plastic. Generally speaking, a piece of plastic is manufactured from an injection molding process. Metal contacts are then wrapped around and snapped in place. Metal leads, designed to be inserted into plated through holes on a printed wiring board, extend from the contact block and couple to the metal contacts. These metal leads are inserted into plated "through holes" in a circuit board. They are then soldered in place, often by way of a wave soldering machine. The contact block is then able to serve as an electrical connector between the electronic circuit and the outside world.

Contact blocks are heavily used in the manufacture of battery packs. All battery packs need an electrical connection to get from the rechargeable cells and internal circuitry to the outside world. This connection is necessary to be able to charge and discharge the cells. This connection is often made with a contact block.

The problem with traditional contact blocks is threefold: First, they are generally large and bulky. Traditional contact blocks typically are a centimeter or so tall, and a centimeter or two across. While one to two cubic centimeters may not sound that large, today's electronic devices, like cellular telephones, are getting smaller and smaller. Battery designers simply can not afford that much space, as some cellular telephones are now less than a centimeter thick.

Second, traditional contacts blocks, with axial leads, require solder to be applied from the bottom of the board. In an automated process, this solder is generally applied by a wave solder process. The problem is that many of today's circuit boards include only surface mounted components, all of which may be connected to the board by way of a reflow solder process. To add a through hole contact block requires either a separate wave solder machine and process, or worse, a separate hand soldering process. Both of these processes add both time and cost to the manufacture of the contact block.

Third, they are often cumbersome to construct. A piece of plastic must first be independently molded. Electrical contacts, generally requiring a U-shaped bend, must then be coupled to the plastic support member via a separate operation. These processes add both thickness and cost to the resulting contact block.

There is thus a need for an improved contact block.

DETAILED DESCRIPTION OF THE INVENTION

Figure 1:
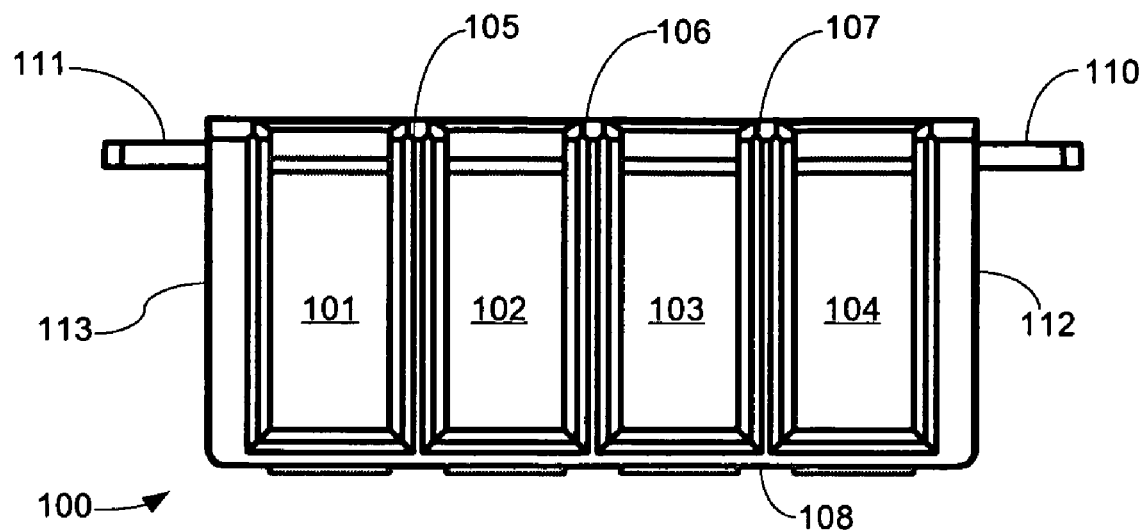
FIGS. 1–4 illustrate various views of a low-profile contact block in accordance with the invention.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 2:
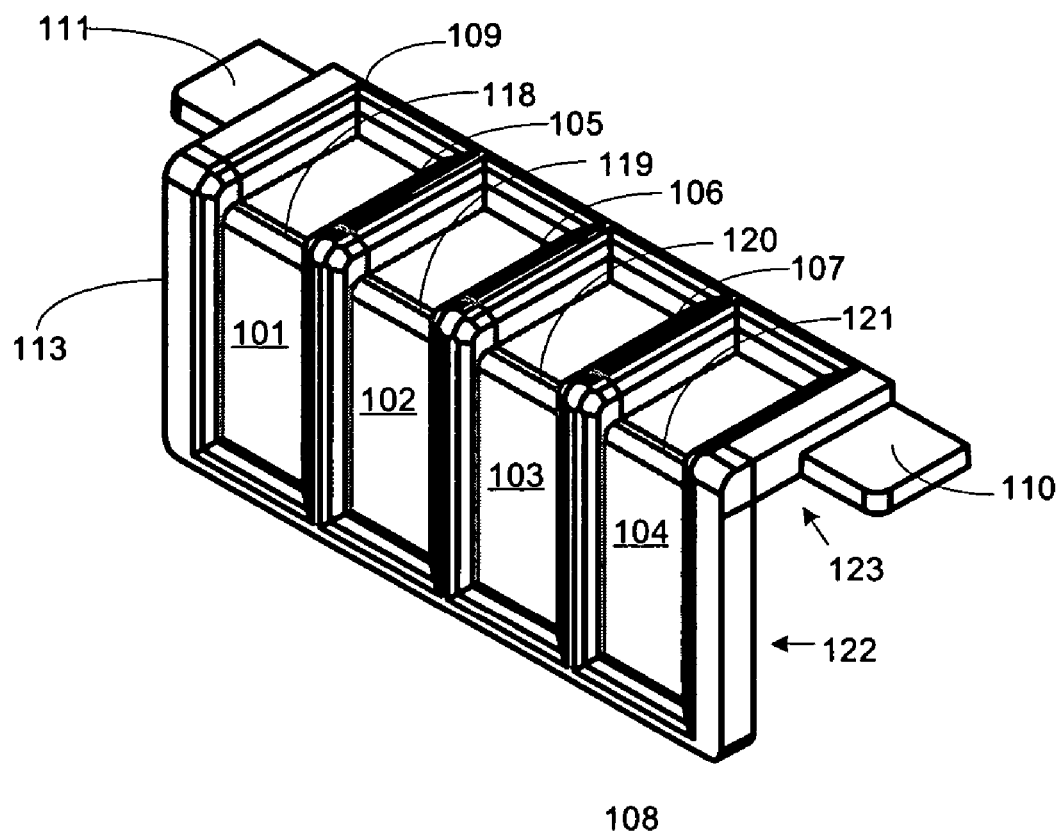
Figure 3:
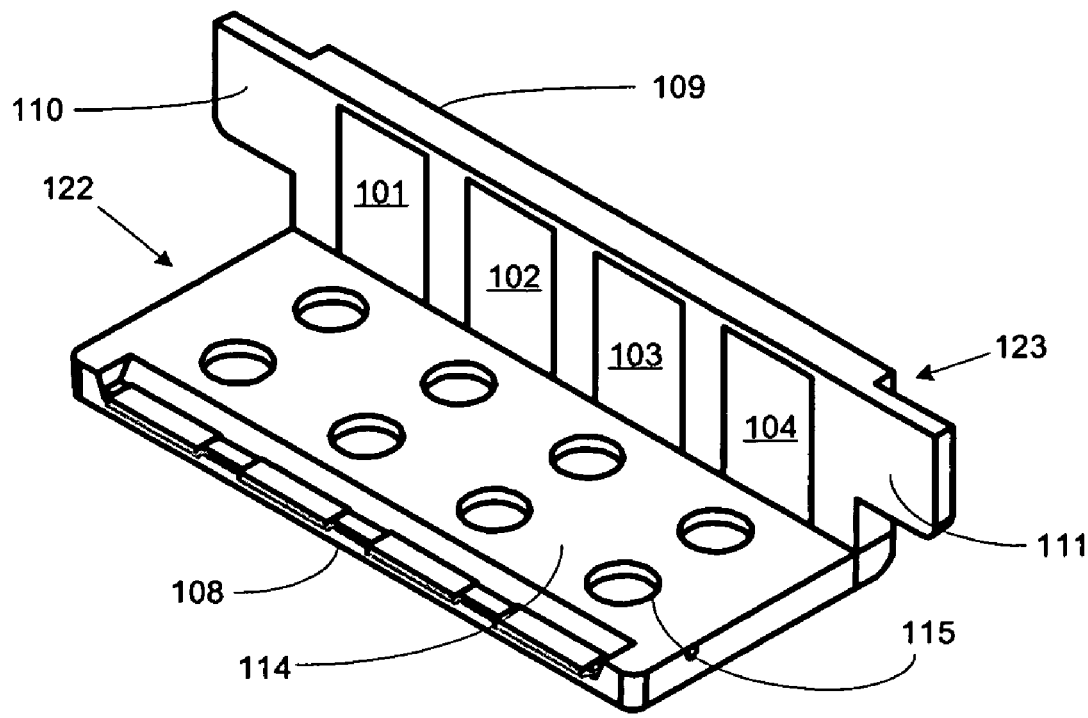
Figure 4:
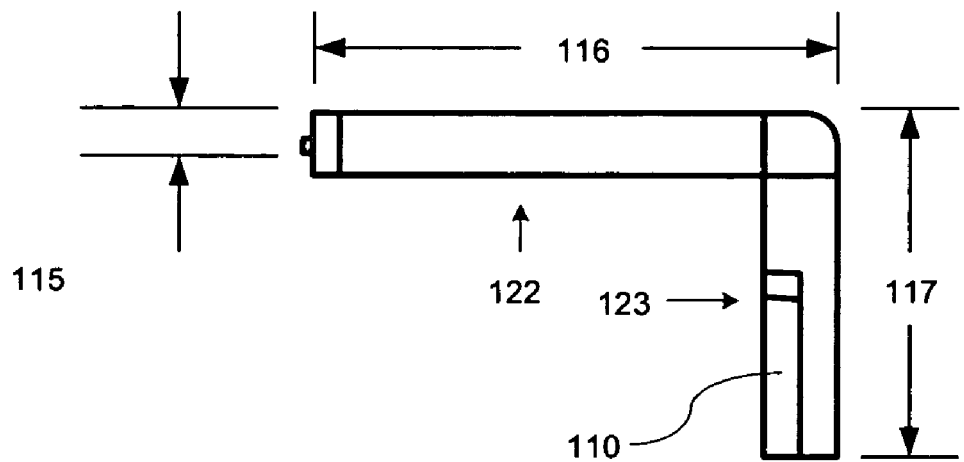

Turning now to FIGS. 1–4, illustrated therein are various plan and isometric views of a contact block in accordance with the invention. While some elements are visible, for example, in the front plan view (FIG. 1), and others are visible in a bottom, right, rear isometric view (FIG. 3), FIGS. 1–4 will be referred to collectively for ease of discussion. FIG. 1 is a front, elevated view; FIG. 2 is a top, front, left, isometric view; FIG. 3 is a bottom, rear, right, isometric view; and FIG. 4 is a left, elevated view. From these four views, all of the elements of the contact block can bee seen.

A plurality of electrically conductive members 101–104 are disposed in a plastic housing. In this exemplary embodiment, four conductive members 101–104 are shown, although the invention is not so limited. It will be clear to those of ordinary skill in the art having the benefit of this disclosure that the invention could easily be adapted to accommodate any number of conductive members.

The electrically conductive members 101–104 are generally thin, metal tabs or contacts. Each has a front face or planar surface, as visible in FIGS. 1 and 2, and a rear face or planar surface, as shown in FIG. 3. The conductive members 101–104 each include an "L-shaped" bend 118–121. The faces of the conductive members 101–104 run across the L-shaped bends 118–121, so as to have exposure from the first side 122 and the second side 123 of the "L".

The plastic housing includes a plurality of bracing members 105–107,108,109,112,113 or bracing "ribs". The bracing members include central bracing members 105–107, outer support members 112,113 and end support members 108,109. The central bracing members 105–107, outer support members 112,113 and end support members 108,109 circumscribe the conductive members 101–104. For example, outer support member 113, end support member 108, central bracing member 105 and end support member 109 circumscribe conductive member 101.

An optional rear support member 114 spans across the back faces of the conductive members 101–104. As will be seen in FIGS. 5 and 6, in one preferred embodiment, the contact block 100 may be coupled to a printed wiring board such that the first side 122 of the contact block 100 hangs off the edge of the printed wiring board. In such embodiments, the rear support member 114 acts as a mechanical support against forces applied to the outer faces of the conductive members 101–104 in a direction parallel to the printed wiring board.

The rear support member may include circular apertures 115 to allow exposure of the rear faces of the conductive members 101–104. In so doing, at least a portion of the front faces of the conductive members 101–104, and at least a portion of the rear faces of the conductive members 101–104 are exposed from the plastic housing of the contact block 100.

Stabilization arms 110,111 may be optionally included in the construction of the contact block 100. As one application for the contact block 100 is in an automated assembly process, automated equipment may be used to "pick and place" the contact block 100. As such, stabilization arms 110,111, extending distally from the outer support members 112,113 may be employed to ensure that the contact block 100 is placed flush against the printed wiring board.

The conductive members 101–104 are preferably coupled to the bracing members 105–107,108,109,112,113 by way of insert molding. In the insert molding process, the conductive members 101–104 are placed in a tooled, mold cavity. Plastic, like polycarbonate, ABS, or polycarbonate ABS is then inserted into the mold cavity about the conductive members 101–104. The resulting contact block 100, having the conductive members 101–104 joined to the bracing members 105–107,108,109,112,113, with at least a portion of the front and rear faces exposed, may then be removed from the mold cavity. The insert molding process eliminates the need to apply metal contacts to a piece of injection molding plastic as with prior art contact blocks.

Additionally, through insert molding, the contact block 100 of the present invention is extremely low-profile. Experimental results have shown that the thickness 115 of the contact block can be less than 0.75 mm. For example, one experimental part had a thickness of 0.60 mm. In that particular test part, the length 116 of the first part 122 of the L was less than 3.5 mm, measuring 3.33 mm. The length 117 of the second part 117 of the L was less than 5.5 mm, measuring 5.03 mm. These low-profile measurements, in comparison to the prior art, greatly reduce the volume within an electronic product that is occupied by the contact block.

Figure 5:
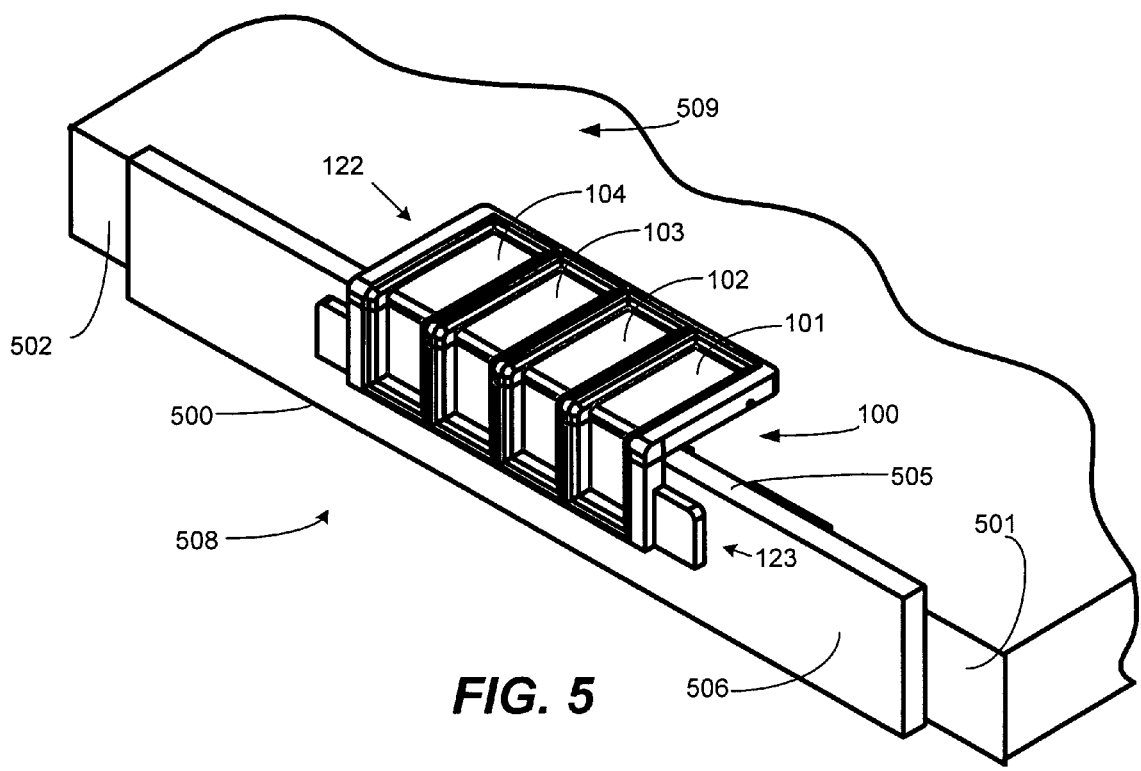
FIGS. 5–6 illustrate a printed circuit board assembly utilizing a contact block in accordance with the invention.
Figure 6:
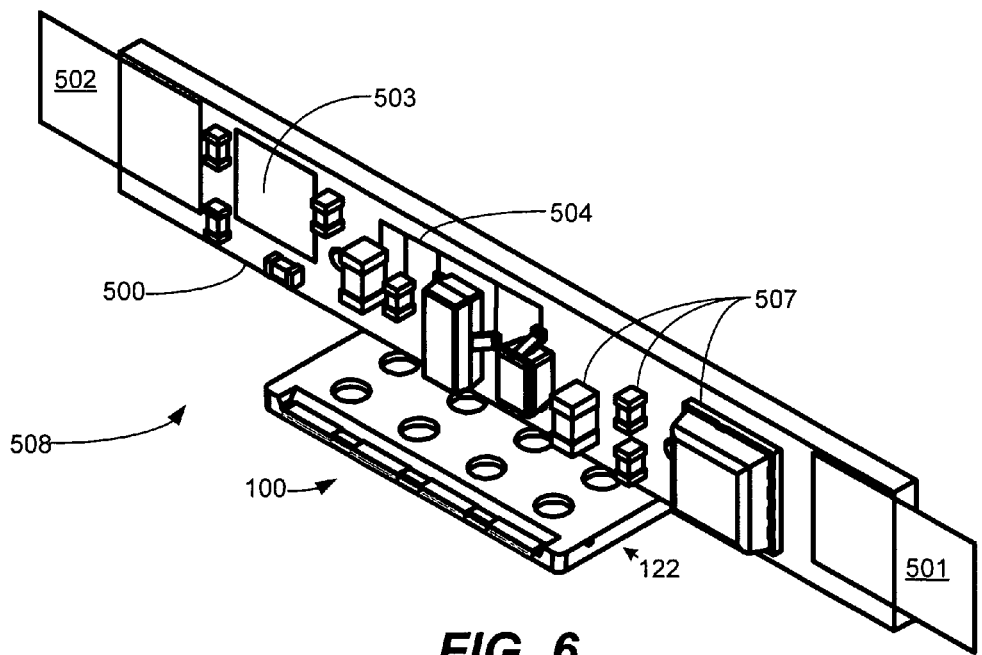

Turning now to FIGS. 5 and 6, illustrated therein are two views of a printed circuit board assembly utilizing a contact block in accordance with the invention. The contact block 100 of FIGS. 1–4 is coupled to a printed wiring board 500 having a plurality of electrically conductive pads (e.g. 503) and traces (e.g 504) disposed thereon. Note that a "printed wiring board", as the term is generally used, refers to an unpopulated, electronic circuit board that has pads and traces. A "printed circuit board", as the term is generally used, refers to a printed wiring board that is populated with electrical and mechanical components (e.g. 507).

The printed wiring board 500 has at least one planar face 506 and at least one edge 505. The contact block 100 is placed upon the printed wiring board 500 such that the first side 122 of the L is substantially perpendicular to the face 506 and extends over the edge 505. The second side 123 of the L is substantially parallel to the face 506 of the printed wiring board 500. The term "substantially" is used to acknowledge the fact that due to manufacturing tolerances, absolute parallel and perpendicular alignments are impossible to achieve. Note also that the perpendicular alignment of the first side 122 is not mandatory. Various applications may employ various angles of projection relative to the printed wiring board 500.

The contact block 100 is preferably coupled to the printed wiring board 500 by placing the conductive members 101–104 atop electrically conductive pads (hidden under the conductive members 101–104 on the face 506 of the printed wiring board). The conductive members 101–104 may then be permanently connected to the conductive pads by soldering. An efficient way of achieving this coupling is by way of a reflow soldering process.

In the reflow soldering process, an automated machine generally applies a solder paste to the conductive pads on the face 506 of the printed wiring board 500. Another automated machine then "picks and places" the contact block 100 such that the conductive members 101–104 become seated upon the solder paste covered conductive pads. When this occurs, with an L-shaped contact block, the first side 122 is positioned substantially perpendicular to the face 506 of the printed wiring board 500, and the second side 123 is substantially parallel to the face 506 of the printed wiring board 500. Heat is then applied to the printed wiring board 500, generally by way of a reflow oven, to cure the solder paste and permanently couple the contact block 100 to the printed wiring board 500.

Once coupled, the printed circuit board assembly 508 may then be used to couple internal components of an electronic device to external devices. For example, in the rechargeable battery pack application, the printed circuit board 508 may include electronic circuitry like safety circuits, charging circuits and fuel gauging circuits. The printed circuit board 508 may couple to the rechargeable cells 509 by way of metal tabs 501,502 coupled to the printed wiring board 500. The low-profile contact block 100 may then be used to couple to external devices like chargers, power supplies and host electronic devices The contact block of the present invention offers numerous advantages over prior art contact blocks. To begin, the overall size of electronic devices—like battery packs for example—can be minimized. This is primarily achieved by the thin width of this contact block. Second, when an L-shaped contact block is employed, the designer has more flexibility in contact block placement within the electronic device. Third, rotational problems, during automated placement for example, are eliminated by the thin and lightweight design of the contact block.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims.

What is claimed is:

1. A printed circuit board assembly, comprising:
   a. a printed wiring board having electrically conductive pads and traces thereon, the printed wiring board having at least one face and at least one edge;
   b. a L-shaped contact block coupled to the board such that a first side of the L-shaped contact block is substantially perpendicular to the at least one face and extends over the at least one edge, and the second side of the L-shaped contact block is substantially parallel to the at least one face;
   wherein the L-shaped contact block comprises a plurality of L-shaped electrically conductive contacts, and wherein the plurality of L-shaped electrically conductive contacts are electrically coupled to the electrically conductive pads by soldering.

2. The contact block of claim 1, wherein the L-shaped contact block has a thickness of less than three-quarters of a centimeter.

3. The contact block of claim 1, wherein the first side of the L-shaped cross section has a length of less than three and a half millimeters.

4. The contact block of claim 3, wherein the second side has a length of less than five and a half millimeters.

5. The assembly of 1, wherein the plurality of L-shaped electrically conductive contacts are electrically coupled to a plurality of electrically conductive pads on the printed wiring board.

6. The assembly of 5, wherein the electrical coupling of the plurality of L-shaped electrically conductive contacts and the plurality of electrically conductive pads is accomplished by reflow soldering.

7. An electronic device having a printed circuit board assembly, comprising:
   a. a printed wiring board having electrically conductive pads and traces thereon, the printed wiring board having at least one face and at least one edge;
   b. a L-shaped contact block coupled to the board such that a first side of the L-shaped contact block is substantially perpendicular to the at least one face and extends over the at least one edge, and the second side of the L-shaped contact block is substantially parallel to the at least one face, wherein the L-shaped contact block comprises a plurality of L-shaped electrically conductive contacts; and
   c. at least one rechargeable cell that electrically couples to the printed wiring board.

* * * * *